United States Patent
Long et al.

(10) Patent No.: US 7,696,088 B2
(45) Date of Patent: Apr. 13, 2010

(54) MANUFACTURING METHODS OF METAL WIRE, ELECTRODE AND TFT ARRAY SUBSTRATE

(75) Inventors: Chunping Long, Beijing (CN); Xinxin Li, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 98 days.

(21) Appl. No.: 11/958,634

(22) Filed: Dec. 18, 2007

(65) Prior Publication Data

US 2008/0166838 A1 Jul. 10, 2008

(30) Foreign Application Priority Data

Jan. 4, 2007 (CN) ........................ 2007 1 0063235

(51) Int. Cl.
H01L 21/44 (2006.01)
(52) U.S. Cl. ................ 438/670; 438/951; 257/E21.034
(58) Field of Classification Search ................. 438/577, 438/670, 951; 257/E21.034
See application file for complete search history.

(56) References Cited

U.S. PATENT DOCUMENTS

| 6,686,661 | B1 | 2/2004 | Lee et al. |
| 6,727,188 | B2 | 4/2004 | Jo et al. |
| 6,780,784 | B2 | 8/2004 | Jo et al. |
| 6,858,479 | B2 | 2/2005 | Kim et al. |
| 6,861,368 | B2 * | 3/2005 | Chae .......................... 438/738 |
| 6,881,679 | B2 | 4/2005 | Jo et al. |
| 6,961,101 | B2 | 11/2005 | Hwang et al. |
| 7,052,993 | B2 | 5/2006 | Lee et al. |
| 7,224,354 | B2 * | 5/2007 | Ko et al. ...................... 345/211 |
| 7,229,569 | B1 * | 6/2007 | Seki et al. ................... 252/79.1 |
| 7,399,989 | B2 * | 7/2008 | Moriya et al. .................. 257/40 |
| 2005/0016961 | A1 * | 1/2005 | Toda et al. ..................... 216/83 |
| 2006/0178007 | A1 * | 8/2006 | Nakamura et al. .......... 438/675 |
| 2007/0128857 | A1 * | 6/2007 | Jenq et al. .................... 438/643 |

FOREIGN PATENT DOCUMENTS

| CN | 1121259 A | 4/1996 |
| CN | 1728351 A | 1/2004 |
| CN | 1471135 A | 2/2006 |

OTHER PUBLICATIONS

Simon M Sze, Semiconductor Device Physics & Technology, Second edition, Publishing House of Suzhou University, China, Dec. 2002, p. 403 [with English translation] (2 pages).

* cited by examiner

*Primary Examiner*—W. David Coleman
(74) *Attorney, Agent, or Firm*—Hasse & Nesbitt LLC; Daniel F. Nesbitt

(57) ABSTRACT

A method of forming a gate line and gate electrode and a method of manufacturing a TFT array substrate. The metal gate line and gate electrode can be formed by: providing a substrate, forming a photoresist layer on the substrate, a photoresist pattern being formed complementary with that of the gate line and gate electrode, forming a metal Cu thin film or a composite thin film comprising a metal Cu thin film on the substrate, and removing the photoresist pattern and the metal Cu thin film or composite thin film comprising the metal Cu thin film formed thereon from the substrate.

6 Claims, 7 Drawing Sheets

MANUFACTURING METHODS OF METAL WIRE, ELECTRODE AND TFT ARRAY SUBSTRATE

BACKGROUND OF THE INVENTION

The present invention relates to a method of forming a gate line and gate electrode of a liquid crystal display (LCD), a method of forming a data line and source/drain electrodes of a LCD, and a method of manufacturing a TFT array substrate of an LCD.

Due to characteristics such as light weight, thinness, and low power consumption, an LCD is developing as a display of the next generation. Also, an LCD emits no radiation. Liquid crystal molecules with optical anisotropy are interposed between an array substrate and a color film substrate, and images are displayed with change of the refractive index upon application of electrical field. Due to superior display quality and high definition, an active matrix LCD is becoming widely used. A thin film transistor (TFT) as an active switch element is included in each pixel of the active matrix LCD, which utilizes one of the terminals for ON/OFF control and another terminal as a common electrode.

FIG. 1 is a top view showing a conventional array substrate. FIGS. 2a-2e are cross-sectional views taken along line A-A in FIG. 1, showing each stage in the process for fabricating the conventional array substrate.

The array substrate comprises a back-channel etch bottom-gate TFT, a pixel electrode 10, a gate line 1, and a data line 5. The TFT comprises a gate electrode 2, a gate insulating layer 4, a semiconductor active layer 3, a source electrode 6, and a drain electrode 7. The gate electrode 2 and the gate line 1 are connected directly, and the source electrode 6 and the data line 5 are connected directly. A gate line protrusion 11 of the gate line 1 overlaps with the pixel electrode 10, which is for example made of indium tin oxide (ITO), and forms a storage capacitor with the pixel electrode 10. A passivation layer 8 covers the surface of the array substrate, and the drain electrode 7 of the TFT is connected with the pixel electrode 10 through a via hole 9. A scanning signal provided through the gate line 1 to the gate electrode 2 turns on/off the TFT, and a data signal provided through the data line 5 to the source electrode 6 is transmitted via the channel of the TFT to the drain electrode 7 and the pixel electrode 10 connected therewith. The resistance of the gate line 1 affects the loss and delay of signal during signal transmission.

In the LCD described above, a higher reliability and a more competitive power can be obtained by forming electrodes with metal materials of low resistivity and high corrosion-resistance. Typically, metal Al or Al alloys are widely used as the materials for forming metal wires and electrodes in a LCD. However, as the liquid crystal TV sets are becoming popular, LCDs are becoming larger in size and the definition standard also is becoming higher, which require the timing for scanning signal shorter and signal transmission rate of metal wires increasingly faster. To meet these requirements, it is necessary to explore a new metal material with lower resistivity to replace Al and Al alloys to form wires and electrodes to transmit signal. Compared with aluminum (Al), metal copper (Cu) has lower resistivity and higher electro-migration resistance so as to be a suitable substitute metal material. The parameters of various metals are shown in Table I.

TABLE I

| Metal | Resistivity ($\mu\Omega \cdot cm$) Bulk | Resistivity ($\mu\Omega \cdot cm$) Thin Film | Adhesion | Heat Resistance |
|---|---|---|---|---|
| Ag | 1.586 | N/A | Poor | Poor |
| Cu | 1.678 | 2 | Poor | Good |
| Au | 2.4 | 3 | Poor | Good |
| Al | 2.6548 | 4 | Good | Poor |
| Mo | 5.2 | 10 | Good | Good |
| W | 5.65 | 12 | Good | Good |
| Cr | 12.9 | 25 | Good | Good |
| Ti | 42 | 50 | Good | Good |

However, metal Cu has a weak adhesion to glass, has a high diffusivity in silicon and oxides thereof, and is prone to be naturally oxidized, which makes metal Cu unsuitable to be used for scanning wires in a single-layered metal thin film. In general, metal Cu is used along with a blocking layer formed by one or two layers of other metal films, with the blocking layer being interposed between the glass substrate and metal Cu as well as between metal Cu and a semiconductor thin film. The blocking layer can improve the adhesion of the Cu wire to glass, and can also prevent Cu from diffusing into the semiconductor thin film.

A TFT with metal Cu wires and electrodes can be applied to LCDs so as to improve aperture ratio and image quality of the LCDs. A LCD can be manufactured by a conventional five-mask (5 Mask) technology, as shown in FIGS. 2a-2e.

A metal Cu thin film is deposited on a glass substrate 100 as a gate metal layer, and a gate electrode 2 and a gate line 1 connected together are formed by a wet etching method with a gate mask. FIG. 2a shows a cross-sectional view of the gate electrode 2 through line A-A of FIG. 1. A gate insulating layer 4 and a semiconductor active layer 3 such as an amorphous silicon layer are deposited successively on the gate metal, and a semiconductor active layer 3 is formed into an island with an active layer mask, as shown in a cross-sectional view in FIG. 2b. A source/drain metal thin film is deposited, and a source electrode 6, a drain electrode 7 and a data line 5 are formed with a source/drain electrode mask, as shown in a cross-sectional view in FIG. 2c. A passivation film is deposited, and a passivation layer 8 and a via hole 9 in the passivation layer 8 are formed with a passivation layer mask, as shown in a cross-sectional view in FIG. 2d. A transparent conductive thin film is deposited, and a pixel electrode 10 is formed with a pixel electrode mask and connected with the drain electrode 7 through the via hole 9, as shown in a cross-sectional view in FIG. 2e.

TFTs and LCDs utilizing metal Cu electrodes and wires are disclosed in U.S. Pat. Nos. 6,686,661, 6,727,188, 6,780,784, 6,858,479, 6,861,368, 6,881,679, 6,961,101, and 7,052,993. In case that metal Cu is used for the gate line 1 and gate electrode 2, the data line 5, the source electrode 6, and the drain electrode 7, a gate line formed in a multilayered thin film containing Ti, Ta, Mg, Mo, Ag, In or Cr is generally utilized, and a blocking layer and a diffusion-preventing layer are provided above and below the metal Cu thin film, respectively. Since metal Cu is different from metal Al, it is necessary to develop suitable etching solutions and make the etching rates of the metal of the blocking layer and the metal of the diffusion-preventing layer to match that of metal Cu, so as to facilitate forming the pattern of the wires and electrodes of the TFT. Suitable etching solutions in various cases are shown in Table II.

TABLE II

| Gate Metal Alloy | Etching Solution(s) |
|---|---|
| Cu, Cu/Ti, Cu/Ta Cu/Ti, or Cu/Mo | $Cu(OOC)_4$, $CuSO_4$, $M_xSO_3/M_xS_2O_3/M_xS_2O_4$ $H_2O_2$, $CH_3COOH$, $H_2SO_4/HNO_3/HCl/H_3PO_4$, $KCl/NaCl/KHSO_4$ |
| Cu/Ti | $2KHSO_5 \cdot KHSO_4 \cdot K_2SO_4$, HF, $NH_4F$, $KHF_2$, $Na_2SO_3/K_2SO_3/(NH_4)_2SO_3$, $(NH_4)_2SO_3$ |

As shown in Table II, U.S. Pat. Nos. 6,727,188, 6,780,784, and 6,881,679 have disclosed some etching solutions for metal Cu and can obtain a stable etching rate. U.S. Pat. Nos. 6,686,661, 6,858,479, 6,861,368, 6,961,101, and 7,052,993 also form wires and electrodes of a metal Cu thin film with a blocking layer of other metals as well as wires and electrodes of Cu alloys. For example, U.S. Pat. Nos. 6,686,661 and 7,052,993 use a blocking layer of Mg, U.S. Pat. No. 6,858,479 forms wires with Ag/Cu thin film by plating, and U.S. Pat. No. 6,961,101 uses electrodes of Cu—In alloy. The above-mentioned patents proposed one or more materials for the metal blocking layer, or proposed one or more Cu alloys, which requires forming Cu wires and electrodes with different etching solutions. If the components for the blocking layer or the Cu alloy changes, it is necessary to develop a new etching solution, which results in increase of cost during development and manufacture. Furthermore, the fact that the manufacturers use different metals or alloys will also increase the cost of the etching solutions.

SUMMARY OF THE INVENTION

According to embodiments of the present invention, there is provided a method of manufacturing a TFT array substrate having low-resistance metal Cu electrodes and/or metal Cu wires, which are capable of eliminating the degraded display quality due to signal delay and reducing cost of development and manufacturing.

In one aspect of the present invention, there is provided a method of forming a gate line and gate electrode, comprising the steps of:

1) providing a substrate;
2) forming a photoresist layer on the substrate, a photoresist pattern being formed complementary with a pattern of the gate line and gate electrode;
3) forming a metal Cu thin film or a composite thin film comprising a metal Cu thin film on the resulting substrate; and
4) removing the photoresist pattern and the metal Cu thin film or the composite thin film comprising the metal Cu thin film formed thereon from the resulting substrate, so as to form the gate line and gate electrode comprising the metal Cu thin film or the composite thin film comprising the metal Cu thin film.

Preferably, the composite thin film comprising the metal Cu thin film may comprise a first metal or metal compound blocking layer, the metal Cu thin film, and a second metal or metal compound blocking layer, that are stacked in this order. The photoresist layer may have a thickness in a range of about 1 to about 3 μm. In the step 4), the substrate may be immersed into a lifting-off solution to remove the photoresist pattern and the metal Cu thin film or the composite thin film comprising the metal Cu thin film formed thereon. The lifting-off solution may comprise a mixture of isopropanol and copper sulfate, a mixture of isopropanol, copper sulfite and sulfuric acid, or a mixture of isopropanol and sulfurous acid, and where the content of the copper sulfate, the copper sulfite and sulfuric acid, or the sulfurous acid is typically less than 5 weight %.

In another aspect of the present invention, there is provided a method of forming a data line and source/drain electrodes, comprising the steps of:

1) providing a substrate with an active layer formed thereon;
2) forming a photoresist layer on the substrate, a photoresist pattern being formed complementary with a pattern of the data line and source/drain electrodes;
3) forming a metal Cu thin film or a composite thin film comprising a metal Cu thin film on the resulting substrate; and
4) removing the photoresist pattern and the metal Cu thin film or the composite thin film comprising the metal Cu thin film formed thereon from the resulting substrate, so as to form the data line and source/drain electrodes comprising the metal Cu thin film or the composite thin film comprising the metal Cu thin film.

Preferably, the composite thin film comprising the metal Cu thin film may comprise a first metal or metal compound blocking layer, the metal Cu thin film, and a second metal or metal compound blocking layer, that are stacked in this order. The photoresist layer may have a thickness in a range of about 1 to about 3 μm. In the step 4), the substrate may be immersed into a lifting-off solution to remove the photoresist pattern and the metal Cu thin film or the composite thin film comprising the metal Cu thin film formed thereon. The lifting-off solution may comprise a mixture of isopropanol and copper sulfate, a mixture of isopropanol, copper sulfite and sulfuric acid, or a mixture of isopropanol and sulfurous acid, and where the content of the copper sulfate, the copper sulfite and sulfuric acid, or the sulfurous acid is typically less than 5 wt %.

In further another aspect of the present invention, there is provided a method of manufacturing a TFT substrate. The method using the method described above to form a metal gate line and gate electrode or a metal data line and source/drain electrodes in the TFT array substrate.

Compared with the conventional TFT array substrate and the conventional manufacturing method, due to the excellent conductive property of metal Cu electrodes and wires, in the manufacturing method of the TFT array substrate, the formed low resistance metal Cu electrodes and metal Cu wires can eliminate the degraded display quality resulting from signal delay and are particularly beneficial to a high-frequency driven LCD TV set. Moreover, in the methods of the present invention, the metal Cu electrodes and metal Cu wires can be formed by a lifting-off process instead of etching metal Cu with a special etching solution, which reduces cost of development and production.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention.

DETAILED DESCRIPTION OF THE PREFERRED EMBODIMENTS

Figure 1:
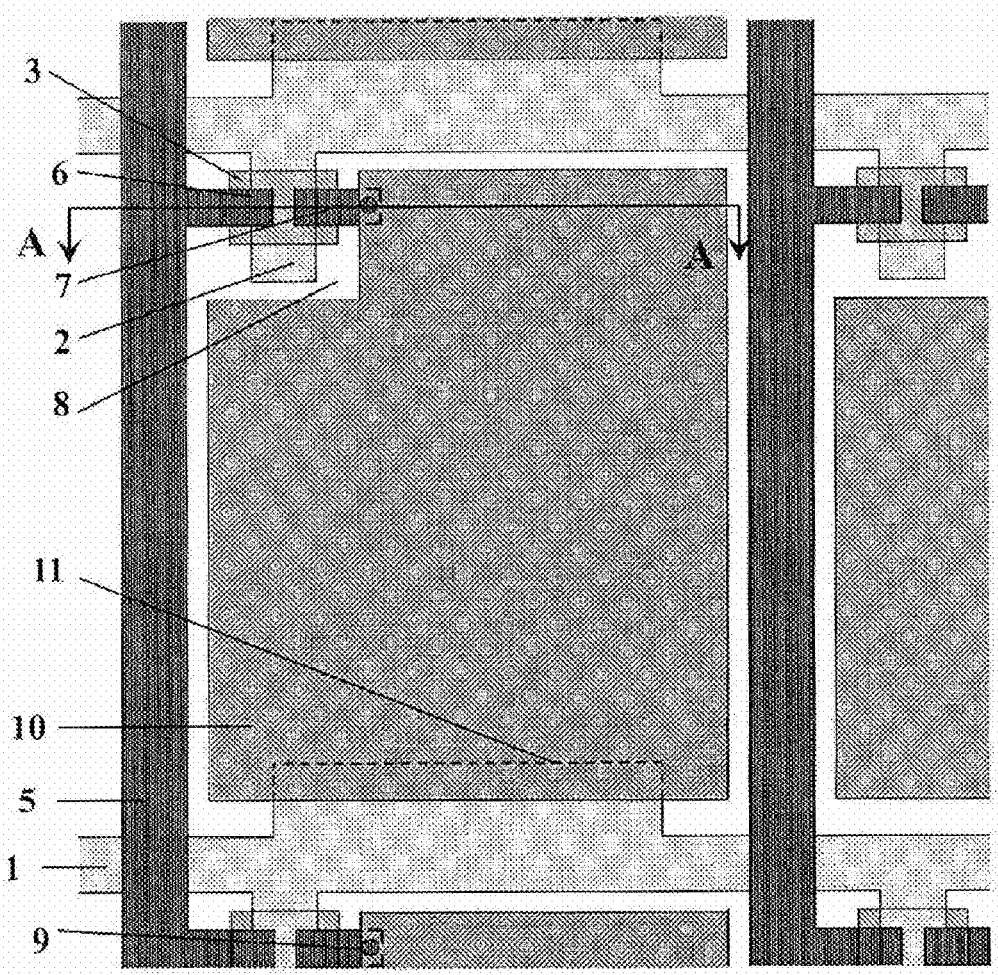
FIG. 1 is a top view of a single pixel on an array substrate of a TFT LCD in the related art.
Figure 2A:
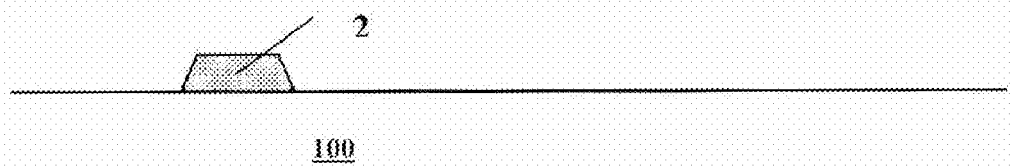
FIGS. 2a-2e are cross-sectional views taken along line A-A in FIG. 1, showing each stage in the manufacturing process of a TFT array substrate in the related art.
Figure 2B:
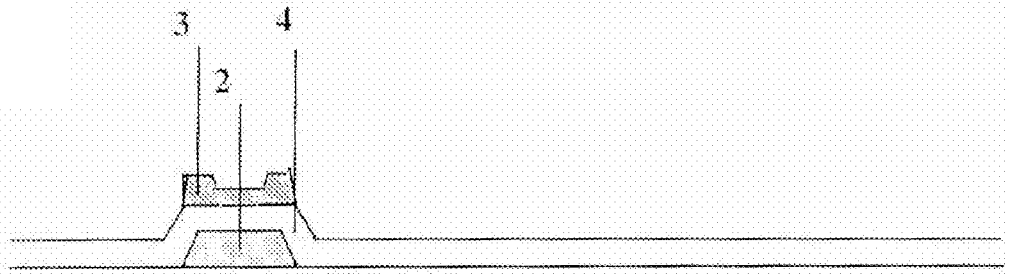
Figure 2C:
Figure 2D:
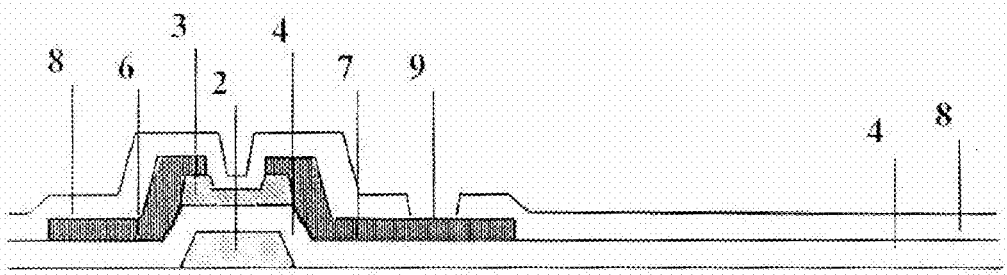
Figure 2E:
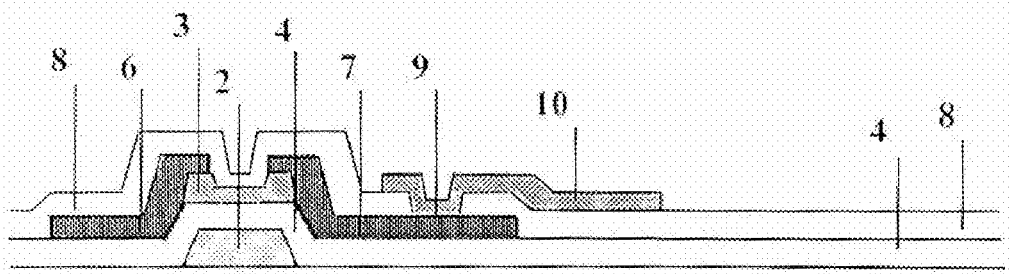

The specific embodiments according to the present invention will be described in detail with reference to the accompanying drawings. It should be noted that, the thickness of a layer and the size and shape of a region in the drawings are not drawn in scale according to the actual device structure, but are illustrative only and not limitative of the present invention. In the description, when a layer or element is referred to as being "on" or "connected to" another layer or element, this layer or element can be directly on or directly connected to the other layer or element, or an intervening layer or element may also be present therebetween.

The First Embodiment

Figure 3A:
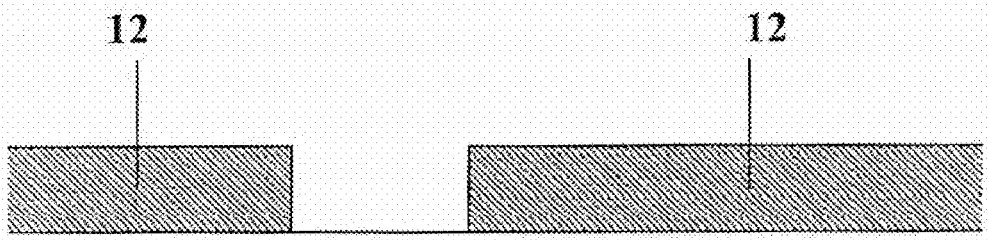
FIGS. 3a-3c illustrate the stages of a method of forming a metal Cu gate line and gate electrode according to the first embodiment of the present invention.
Figure 3B:
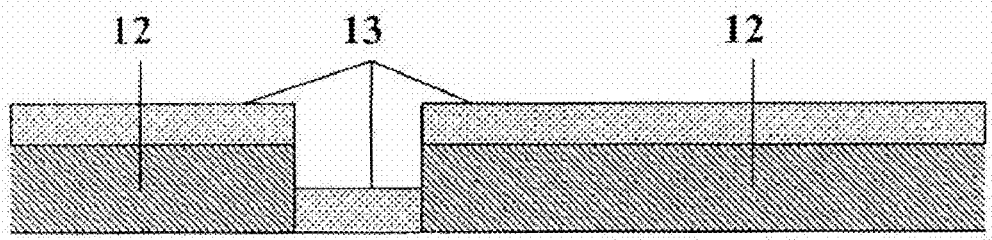
Figure 3C:
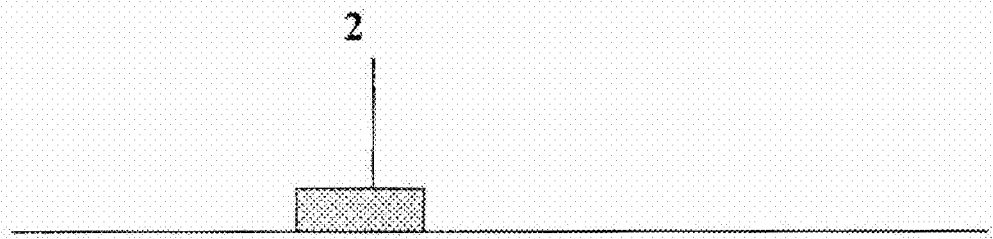

In the first embodiment, a method of forming a gate line and gate electrode with metal Cu or a composite thin film comprising a metal Cu thin film is described, and a method of manufacturing a TFT device and an array substrate is also described. FIGS. 3a-3c illustrate the method of forming the metal Cu gate line and gate electrode according to the first embodiment of the present invention.

Firstly, as shown in FIG. 3a, a photoresist layer with a thickness ranging from 1 μm to 3 μm is coated on a substrate such as a glass substrate 100, a photoresist pattern 12 is formed by exposure and development, and the photoresist pattern 12 is complementary with that of the gate line and gate electrode to be formed, that is to say, the gate line and gate electrode are formed in the void portions of the photoresist pattern 12. Then, a metal Cu thin film 13 or a composite thin film comprising a metal Cu thin film and other metal thin film or alloy thin film with a thickness of about 1000 to about 10,000 Å is deposited on the whole surface of the substrate, for example, by magnetron sputtering. The sputtering of the metal thin film is generally performed in a vacuum atmosphere with pressure less than 10 Pa, and Ar with a flux of about 30 to about 400 standard cubic centimeters per minute (seem) for each square meter of the substrate is used as a bombardment ion gas and bombards a metal target with a power of about 0.5 to about 50 W/cm$^2$. The deposition of metal Cu thin film and other metal or alloy thin film can be conducted in a same sputter apparatus or in different sputtering apparatuses, and the alloy thin film can also be formed by other thin film deposition method such as chemical vapor deposition (CVD). The other metal comprises Mg, Cr, Mo, Al, Ti, W, Ag, Ta, etc., and the alloy thin film may be a thin film of a metal compound such as titanium nitride and tantalum nitride, or in turn another composite thin film of titanium and titanium nitride, or tantalum and tantalum nitride. Nitrogen ($N_2$) can be used a carrier gas for the bombardment ions during the formation of a metal compound such as titanium nitride or tantalum nitride in the sputtering apparatus. The above-mentioned other metal thin film or alloy thin film can be used as a blocking layer for the metal Cu thin film, and is disposed above or below the metal Cu thin film or both. The blocking layer typically has a thickness of about 10 to about 100 nm.

Figure 8:
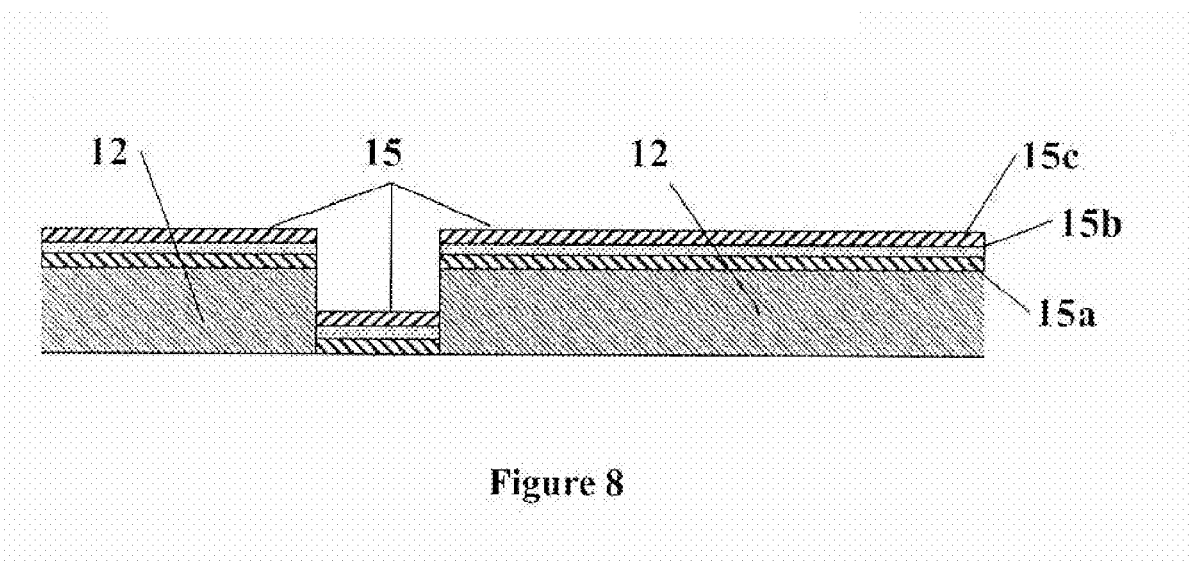
FIG. 8 shows an alternative embodiment of the formed substrate of FIG. 3b including a composite thin film comprising a metal Cu thin film.

As shown in FIG. 3b, the above metal Cu thin film 13 or the composite thin film comprising a metal Cu thin film with the same thickness and structure is formed both within the opening of the photoresist pattern 12 and on the surface of the photoresist pattern 12. As shown in FIG. 8, the composite thin film 15 comprising the metal Cu thin film may comprise a first metal or metal compound blocking layer 15a, the metal Cu thin film 15b, and a second metal or metal compound blocking layer 15c, that are stacked in this order. Then, the resulting whole glass substrate deposited with the metal Cu thin film 13 or the composite thin film comprising a metal Cu thin film is immersed into a lifting-off solution, the photoresist layer and the metal thin film deposited thereon are removed by a lifting-off process so as to form the gate line and gate electrode, as shown in FIG. 3c. In general, the lifting-off solution comprises the mixture of isopropanol and copper sulfate, the mixture of isopropanol, copper sulfite and sulfuric acid, or the mixture of isopropanol and sulfurous acid, in which the copper sulfate, the copper sulfite and sulfuric acid, or the sulfurous acid has a percentage in weight lower than 5 wt %. Alternatively, sodium sulfate, potassium sulfate, sodium sulfite, potassium sulfite, or a mixture thereof can be further added into the lifting-off solution. After lifting-off, the cross-sectional view of the formed gate line and gate electrode is shown in FIG. 3c. Without being bound by any theory, the lifting off solution is believed to dissolve the photoresist layer from under the metal thin film deposited thereon.

Next, a gate insulating layer 4 with a thickness of about 1000 to about 8000 Å and a semiconductor active layer 3 of amorphous silicon with a thickness of about 1000 to about 5000 Å are successively deposited on the substrate by CVD. The gate insulating layer 4 comprises silicon nitride, silicon oxide, silicon oxynitride, etc. A source/drain metal layer with a thickness of about 1000 to about 5000 Å is deposited on the semiconductor active layer 3, and the source/drain metal layer comprises Al, Mo, Cr, Al—Nd alloy, or a combination thereof. Similarly to the formation of the gate metal layer, the source/drain metal layer is deposited on the substrate by magnetron sputtering. After exposure and development with a gray tone mask for the source/drain electrode, the source/drain metal layer and the amorphous silicon thin film are etched by a multiple-step etching and an ashing process, thereby forming the patterns of a data line 5, a source electrode 6 and a drain electrode 7, and the semiconductor active layer 3, as shown in cross-sectional view in FIG. 4a. The etching method for the source/drain electrode can be a wet chemical etching process, and can also be a plasma etching process which is used for amorphous silicon. The source electrode 6 and the drain electrode 7 contact with two ends of the patterned semiconductor active layer 3, respectively.

The multiple-step etching and ashing process can be performed as follows. After forming a three-dimension photoresist pattern with a thinner thickness in a channel region and a thicker thickness in source/drain electrode regions, the source/drain metal layer that is not covered by the photoresist pattern is first etched with a wet etching method, the ashing process is performed to thin the thickness of the photoresist layer and thus remove the photoresist in the channel region, the exposed semiconductor active layer 3 is etched with a drying etching method to form a silicon island. Next the source/drain metal layer exposed in the channel region is further etched with a wet etching method to expose the channel region.

Figure 4A:
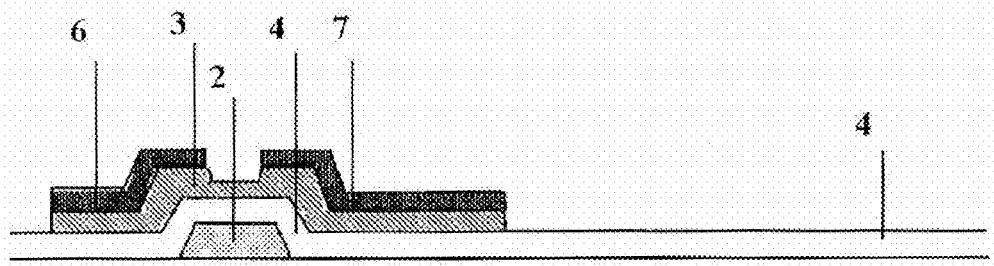
FIG. 4a is the cross-sectional view along line A-A of FIG. 1, showing the pixel after source/drain electrodes are formed according to the first embodiment.
Figure 4B:
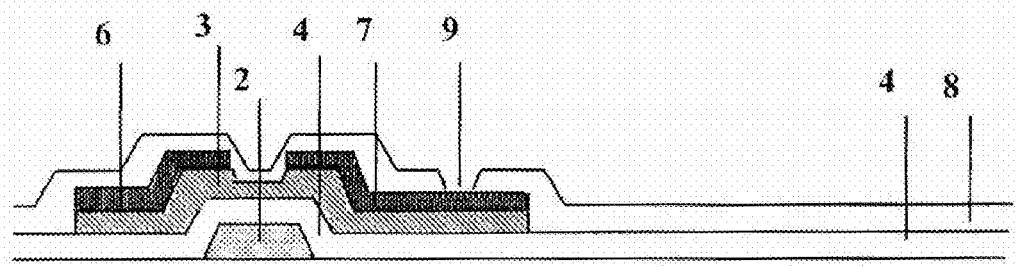
FIG. 4b is the cross-sectional view showing the pixel after a passivation layer via hole is formed according to the first embodiment.
Figure 4C:
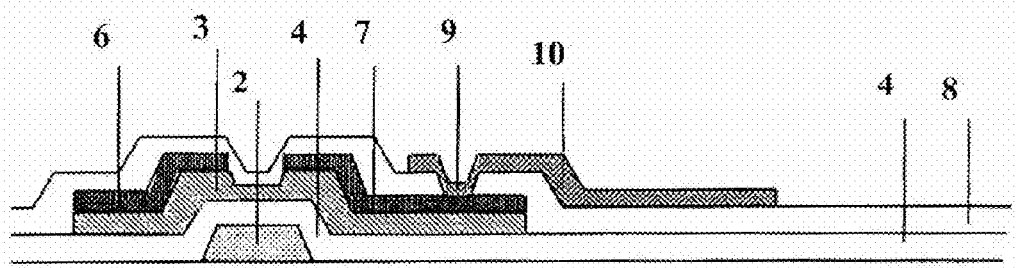
FIG. 4c is the cross-sectional view showing the pixel after a pixel electrode is formed according to the first embodiment.

Similarly to the formation of the gate insulating layer 4 and the semiconductor active layer 3, a passivation layer 8 with a thickness of about 1000 to about 6000 Å is deposited on the resulting entire substrate. The material for the passivation layer 8 may be silicon nitride. After exposure with a via hole mask, a passivation layer via hole 9 is formed with a dry etching method which is similar to that for etching the semiconductor active layer, and the resulting structure is shown in FIG. 4b. An indium tin oxide (ITO) layer with a thickness of about 100 to about 1000 Å is deposited on the substrate. After exposure with a pixel electrode mask, the ITO layer is etched with a wet etching method to form a pixel electrode 10, as shown in FIG. 4c. The pixel electrode 10 is connected with the drain electrode 7 through the via hole 9.

Figure 5A:
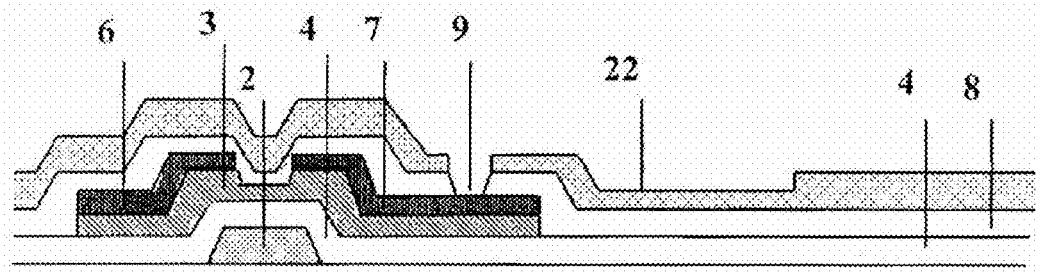
FIG. 5a is the cross-sectional view showing the pixel after a three-dimension photoresist pattern and a passivation layer via hole are formed according to the first embodiment.
Figure 5B:
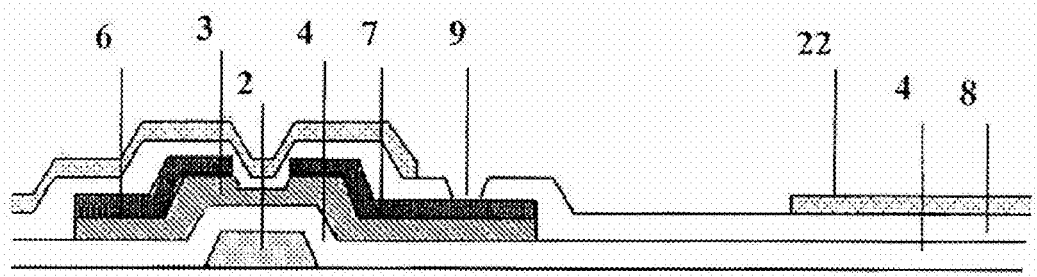
FIG. 5b is the cross-sectional view showing the pixel after the three-dimension photoresist pattern is ashed according to the first embodiment.

In the method described above, the TFT substrate with the metal Cu gate line and gate electrode are fabricated with four masks, but it can also be fabricated with other method such as a three mask method. After formation of the data line 5, the source electrode 6 and the drain electrode 7, and the silicon island 3, a passivation layer 8 with a thickness of 1000~6000 Å is deposited on the entire substrate. A three-dimension photoresist pattern 22 as shown in FIG. 5a is formed with a gray tone mask. In the photoresist pattern 22, the portion corresponding to the via hole 9 is void, and the portion corresponding to the pixel electrode 10 is thinner and has a shape consistent with the pixel electrode 10. The passivation layer via hole 9 are formed by dry etching. The thickness of the portion of the photoresist layer corresponding to pixel electrode 10 is about 1000 to about 10,000 Å, while the thickness of other portions is about 15,000 to about 30,000 Å. By performing an ashing process on the photoresist pattern, the portion with the thickness of about 1000 to about 10,000 Å is removed, while those with the thickness of about 15,000 to about 30,000 Å are partially retained, as shown in FIG. 5b. Then, an ITO thin film with a thickness of about 100 to about 1000 Å is deposited on the substrate, the photoresist together with the ITO thin film formed thereon is completely removed by an lifting-off process, and the ITO thin film in the passivation layer via holes 9 and on the passivation layer is retained, thus a pixel electrode 10 is formed so as to obtain the TFT substrate as shown in FIG. 4c.

The Second Embodiment

In the second embodiment, a method of forming a gate line and gate electrode, a data line, and source/drain metal electrodes with a metal Cu thin film or a composite thin film comprising a metal Cu thin film is described, and a method of manufacturing a TFT device and an array substrate is also described.

Figure 6:
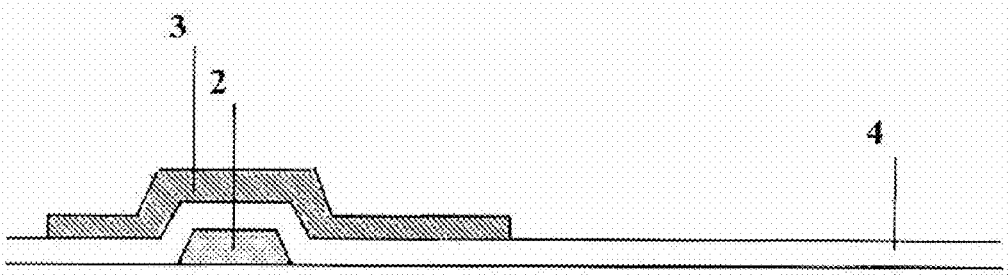
FIG. 6 is the cross-sectional view along line A-A of FIG. 1, showing the pixel after a semiconductor active layer is formed according to the second embodiment.

Firstly, the gate line and gate electrode are formed by the same method as that in the first embodiment. Next, a gate insulating layer 4 with a thickness of about 1000 to about 8000 Å and a semiconductor active layer 3 of amorphous silicon with a thickness of about 1000 to about 5000 Å are successively deposited on the substrate by CVD. The gate insulating layer comprise silicon nitride, silicon oxide, silicon oxynitride, etc. An active layer island, as shown in FIG. 6, is formed by etching on the gate insulating layer 4.

Figure 7A:
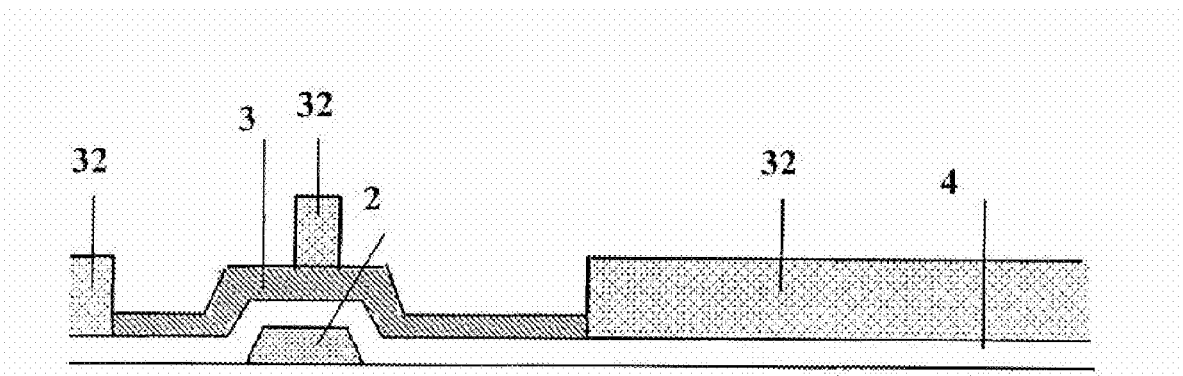
FIGS. 7a-7c shows the stages of a method of forming a data line, and source and drain electrodes according to the second embodiment of the present invention.
Figure 7B:
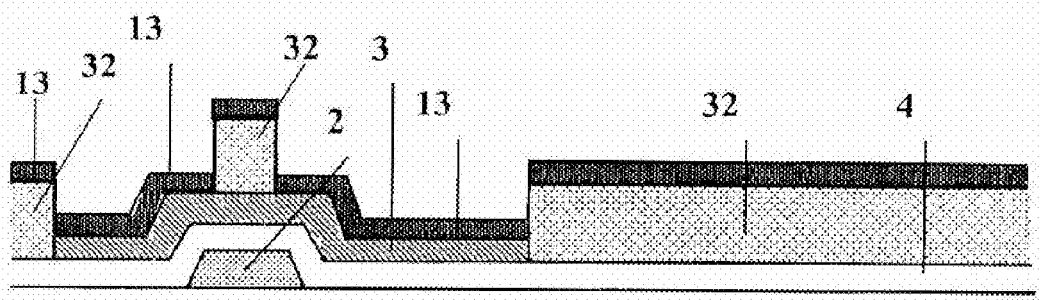
Figure 7C:
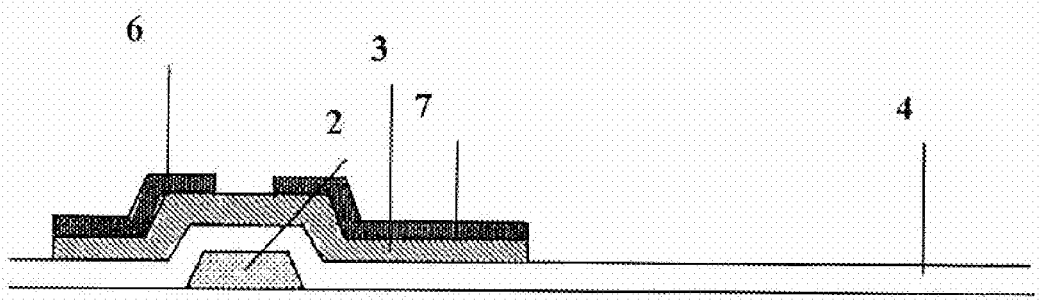

Next, as shown in FIG. 7a, a photoresist layer with a thickness of 1~3 μm is formed on the semiconductor active layer 3 and the gate insulating layer 4, and a photoresist pattern 32 is formed complementary with that of the data line, the source and drain electrodes to be formed. As shown in FIG. 7b, a metal Cu thin film 13 or a composite thin film comprising a metal Cu thin film with a thickness of about 1000 to about 5000 Å is deposited on the whole surface of the substrate. The material and fabrication method for the metal Cu thin film 13 or the composite thin film comprising a metal Cu thin film are similar to those for the gate line and gate electrode described in the first embodiment. Thereafter, the resulting substrate is immersed into a lifting-off solution, the photoresist and the metal thin film deposited thereon are removed together by a lifting-off process to form the data line 5, the source electrode 6 and the drain electrode 7, and also expose the portion of the semiconductor active layer 3 in a channel region. The source electrode 6 and the drain electrode 7 contact with two ends of the patterned semiconductor active layer 3, respectively. Further, the semiconductor active layer 3 can be etched with the source electrode 6 and the drain electrode 7 as an etching mask, to remove the exposed ohmic contact layer formed as a doped semiconductor thin film on the semiconductor active layer 3 and form the channel of the TFT, as shown in FIG. 4a. Similar to the formation of the gate insulating layer 4 and the semiconductor active layer 3, a passivation layer 8 with a thickness of about 1000 to about 6000 Å is deposited on the resulting entire substrate. The material for the passivation layer 8 may be silicon nitride. After exposure with a via hole mask, a passivation layer via hole 9 is formed by etching with a dry etching method which is similar to that for the semiconductor active layer 3, and the resulting structure is shown in FIG. 4b. An ITO thin film with a thickness of 100~1000 Å is deposited on the substrate. After exposure with a pixel electrode mask, the ITO thin film is etched by wet etching to form the pixel electrode 10 so as to obtain the TFT substrate as shown in FIG. 4c.

In the method of the second embodiment, the TFT substrate is fabricated with five masks, but it can also be fabricated with four masks. After formation of the data line 5, the source electrode 6 and the drain electrode 7, and the silicon island 3, a passivation layer 8 with a thickness of about 1000 to about 6000 Å is deposited on the entire substrate. A three-dimension photoresist pattern 22 as shown in FIG. 5a is formed with a gray tone mask. In the photoresist pattern 22, the portion corresponding to the via hole 9 is void, and the portion corresponding to the pixel electrode 10 is thinner and has a shape consistent with the pixel electrode 10. The passivation layer via hole 9 are formed by dry etching. The thickness of the portion of the photoresist layer corresponding to pixel electrode 10 is about 1000 to about 10,000 Å, while the thickness of other portions is about 15,000 to about 30,000 Å. By performing an ashing process on the photoresist pattern, the portion with the thickness of 1000~10000 Å is removed, while those with the thickness of about 15,000 to about 30,000 Å are partially retained, as shown in FIG. 5b. Then, an ITO thin film with a thickness of about 100 to about 1000 Å is deposited on the substrate, the photoresist together with the ITO thin film formed thereon is completely removed by an lifting-off process, and the ITO thin film in the passivation layer via holes 9 and on the passivation layer is retained, thus a pixel electrode 10 is formed so as to obtain the TFT substrate as shown in FIG. 4c.

The Third Embodiment

Firstly, the gate line and gate electrode are formed by conventional materials and conventional methods.

Next, the data line, source electrode and drain electrode are formed by the same method as that in the second embodiment.

Finally, the remaining components of the TFT array substrate are formed by the same method as that in the first or second embodiment.

In the embodiments of the present invention, metal Cu with low resistivity is used for the wires and/or the electrodes, and a metal Cu thin film is deposited on the substrate by physical vapor deposition, especially by magnetron sputtering. In the embodiments of the present invention, the problem that metal Cu can difficultly be used in a single-layered thin film as the wires or the electrodes for the TFT substrate due to properties, such as self-oxidization, diffusion, chemical reactivity, and adhesion thereof, can be overcome by forming the wires and/or the electrodes with a metal Cu thin film together with other metal thin film or alloy thin film. In the embodiments of the present invention, the patterns of the metal Cu wires and/or the metal Cu electrodes are formed by a lifting-off process, which is different form the conventional method in which the metal Cu wires and/or electrodes are formed with a wet etching method using etching solutions. Further, according to the embodiments of present invention, it is no need to develop a suitable etching solution for metal Cu. Therefore, the present invention can have advantages over the conventional etching method that uniform cross sections of the metal Cu and other metal thin film or alloy thin film can be obtained and favorable cross sections of the wires and/or electrodes can be also formed without etching metal Cu thin film and the other metal thin film or alloy thin film by using a special etching solution.

In an embodiment of the present invention, there is provided a TFT array substrate with low resistance metal Cu wires and/or electrodes, which efficiently eliminates the degraded display quality due to signal delay and is particularly suitable for a large-size LCD TV set with relatively long wires. In the embodiment of the present invention, there is provided a method of manufacturing metal Cu gate lines without etching solutions, which can reduce the cost of development and production.

It should be appreciated that the embodiments described above are intended to illustrate but not limit the present invention. Although the present invention has been described in detail herein with reference to the preferred embodiments, it should be understood by those skilled in the art that the present invention can be realized with different material and equipment as necessary, and that various modification and equivalents thereof can be made herein without departing from the spirit and scope of the present invention.

What is claimed is:

1. A method of forming a gate line and gate electrode, comprising the steps of:
   1) providing a substrate;
   2) forming a photoresist layer on the substrate, a photoresist pattern being formed complementary with a pattern of the gate line and gate electrode, wherein the photoresist layer has a thickness in a range of about 1 to about 3 µm;
   3) forming a metal Cu thin film or a composite thin film comprising a metal Cu thin film on the resulting substrate; and
   4) removing the photoresist pattern and the metal Cu thin film or the composite thin film comprising the metal Cu thin film formed thereon from the resulting substrate, including immersing the resulting substrate into a lifting-off solution that comprises a mixture selected from the group consisting of a mixture of isopropanol and copper sulfate, a mixture of isopropanol, copper sulfite and sulfuric acid, and a mixture of isopropanol and sulfurous acid, wherein the content of the copper sulfate, the copper sulfite and sulfuric acid, and the sulfurous acid is less than about 5% by weight, so as to form the gate line and gate electrode comprising the metal Cu thin film or the composite thin film comprising the metal Cu thin film.

2. The method according to claim 1, wherein the composite thin film comprising the metal Cu thin film comprises a first metal or metal compound blocking layer, the metal Cu thin film, and a second metal or metal compound blocking layer, that are stacked in this order.

3. A method of manufacturing a TFT array substrate, comprising a step of forming a gate line and gate electrode according to the method of claim 1.

4. A method of forming a data line and source/drain electrodes, comprising the steps of:
   1) providing a substrate with an active layer formed thereon;
   2) forming a photoresist layer on the substrate, a photoresist pattern being formed complementary with a pattern of the data line and source/drain electrodes, wherein the photoresist layer has a thickness in a range of about 1 to about 3 µm;
   3) forming a metal Cu thin film or a composite thin film comprising a metal Cu thin film on the resulting substrate; and
   4) removing the photoresist pattern and the metal Cu thin film or the composite thin film comprising the metal Cu thin film formed thereon from the resulting substrate, including immersing the resulting substrate into a lifting-off solution that comprises a mixture selected from the group consisting of a mixture of isopropanol and copper sulfate, a mixture of isopropanol, copper sulfite and sulfuric acid, and a mixture of isopropanol and sulfurous acid, wherein the content of the copper sulfate, the copper sulfite and sulfuric acid, and the sulfurous acid is less than about 5% by weight, so as to form the data line and source/drain electrodes comprising the metal Cu thin film or the composite thin film comprising the metal Cu thin film.

5. The method according to claim 4, wherein the composite thin film comprising the metal Cu thin film comprises a first metal or metal compound blocking layer, the metal Cu thin film, and a second metal or metal compound blocking layer, that are stacked in this order.

6. A method of manufacturing a TFT array substrate, comprising a step of forming a data line, and source and drain electrodes according to the method of claim 4.

* * * * *